United States Patent [19]

Reeder

[11] 4,114,116
[45] Sep. 12, 1978

[54] TWO-DIMENSIONAL SURFACE ACOUSTIC WAVE SIGNAL PROCESSOR

[75] Inventor: Thomas M. Reeder, Glastonbury, Conn.

[73] Assignee: United Technologies Corporation, Hartford, Conn.

[21] Appl. No.: 820,474

[22] Filed: Aug. 1, 1977

[51] Int. Cl.$^2$ .................... H03H 9/26; H03H 9/30; H03H 9/32; H01L 41/10
[52] U.S. Cl. .................... 333/30 R; 333/70 T; 333/72; 364/821
[58] Field of Search .................... 333/30 R, 72, 70 T; 310/313; 364/821; 331/107 A; 330/5.5

[56] References Cited

U.S. PATENT DOCUMENTS

| 3,723,916 | 3/1973 | Speiser et al. ................ 310/313 X |
| 3,770,949 | 11/1973 | Whitehouse et al. ......... 333/30 R X |
| 3,803,395 | 4/1974 | Quate ............................... 310/313 X |

OTHER PUBLICATIONS

Gerard et al., -"Burst Processor Tapped Delay Line" Second Interim Progress Report Technical Report ECOM 0046-2, Jan. 1974; Title pages and pp. 2-11 through 2-16 and 3-11.

Holland et al., -"Practical Surface Acoustic Wave Devices" in Proc. IEEE, vol. 62, No. 5, May 1974; Title page and pp. 582, 594, 595.

Primary Examiner—Eugene La Roche
Assistant Examiner—Marvin Nussbaum
Attorney, Agent, or Firm—M. P. Williams

[57] ABSTRACT

A surface acoustic wave signal processor comprises a piezoelectric substrate having acoustoelectric transducers disposed thereon in discrete channels which run along the direction of propagation of the substrate, there being a plurality of acoustoelectric transducers in each channel which are connected to related ones in adjacent channels, and a transducer in each channel which is electrically independent from related ones in adjacent channels, thereby providing a plurality of ports, each port having a transducer in each of the channels, the transducers of at least one of the ports being electrically interconnected and those of at least one of the ports being electrically independent. A variety of configurations and utilizations are disclosed.

5 Claims, 9 Drawing Figures

TWO-DIMENSIONAL SURFACE ACOUSTIC WAVE SIGNAL PROCESSOR

This invention was made in the course of or under a contract with the Department of the Navy.

FIELD OF ART

This invention relates to surface acoustic wave signal processing, and more particularly to improved, signal-combining, surface acoustic wave processors having additional wave interrelationship capability for increased dimensions of signal processing.

BACKGROUND OF THE INVENTION

The use of signal-combining, surface acoustic wave (SAW) signal processors in the form of tapped delay lines for encoding and correlating fixed and programmable phase shift key (PSK) codes, for providing dispersive and nondispersive filters for generation and detection of various waveforms, and real time signal correlation and convolution of signals through nonlinear wave interaction, is known in the art. In typical SAW signal processor configurations, a pair of waves may be launched by a respective pair of acoustoelectric transducers (referred to herein as launching ports) at the ends of a common interaction region so as to propagate, along the preferred direction of propagation for the substrate, past a plurality of electrically independent acoustoelectric transducers, called taps, dispersed along the propagation path in an interaction region; in such case the taps comprise a receiving port, or an interaction port; and, the two launched waves proceed serially past each of the taps (in either the same or opposite directions), each tap, however, responding at a given moment in time to different discrete portions (usually called "chips") of the two waves, in parallel. Or, the taps may be used as a launching port so that one wave may be launched in a space-dispersed fashion, discrete portions (chips) thereof (corresponding with the number of taps) being launched simultaneously, in parallel at different propagation delay distances from the other ports; in such case, one of the transducers at an end of the interaction region acts as the receiving or interaction port; and both waves proceed serially to the interaction port, discrete portions (chips) of both waves being received serially in time.

In U.S. Pat. No. 4,016,514 to Reeder and Gilden, DIODE COUPLED TAPPED ACOUSTIC DELAY LINE CORRELATOR AND CONVOLVER, acoustoelectric transducers are disposed at opposite ends of the interaction region which has a plurality of taps dispersed thereon. Each of the taps is connected to a nonlinear product mixer (such as diodes operated in their small signal input range) associated therewith, the combined action of which permits product summation of signal components that provide the correlation or convolution functions (in dependence upon use) of signals applied to the SAW signal processor.

In U.S. Pat. No. 4,024,480 to Reeder and Grudkowski, PROGRAMMABLE, AMPLITUDE AND PHASE, GENERAL TRANSVERSAL FILTER, a SAW signal processor having the additional capability of amplitude and phase programming of the product mixers is disclosed. Therein, the nonlinear product mixers provide video product outputs at the sum and difference of the carrier frequencies of the surface acoustic waves impinging on the related taps, at amplitudes which are selectively adjustable on a tap-by-tap basis to provide a desired transducer tap weighting, and at a selected one of two polarities (or phases displaced by 180°) on a tap-by-tap basis. The weighted, phase selected manifestations from each tap are combined, as by summation, and filtered to form a single complex signal. The SAW processor itself is configured with the known tilted-tap arrangement, to reduce absorption, reflections and spurious signal generation in numerous-tap arrays.

In each of these configurations, there is only one possible relationship between the taps and the waves. In the usual case, where the taps comprise the receiving or interaction port, once the tap configuration is defined so as to establish its relationship with respect to one of the launched waves, its configuration has also been defined and fixed with respect to the other of the launched waves. When the taps are used as a launching port, although the relationship between the wave launched thereby and the wave launched at a single-transducer port at one of the ends of the interaction region can be adjusted by adjusting the spatial relationship of the taps, the relationship between the other launched wave and the single-transducer receiving port is, of course, strictly serial. And, the relationship between the wave launched by the taps and the other wave is fixed by the relationship between the wave launched by the taps and the receiving port. Thus, definition of one relationship inherently carries with it an automatic definition of the other relationship. This may be referred to as a unidimensional wave/tap dependence which renders it impossible to provide independent relationships between the two waves and the receiving or interaction port, regardless of how the SAW module is driven. One consequence of this interdependency of tap relationships to the respective waves is illustrated in the aforementioned Reeder and Gilden patent wherein the achievement of complex processing, such as performance of the discrete Fourier transform, requires utilization of the SAW processor module (including the product mixers relating to its taps) in conjunction with numerous external circuit elements in a complicated, time-related system. And, although utilizing the programmable product mixers of the Reeder and Grudkowski patent with a SAW module configured as in the Reeder and Gilden patent solves the functional problem in the theoretical sense, it does not alleviate the problem due to the fixed relationship between the taps and the other two ports which inherently provides excessive absorption and reflection in a device having sufficient taps (e.g., 256 or more) to segment the waves for meaningful analysis.

SUMMARY OF THE INVENTION

The object of the invention is to provide surface acoustic wave signal processors having new dimensions of signal processing capability.

This invention is predicated on the fact that properly-manufactured SAW signal processors are essentially linear at any power level typically used for signal processing. That is, the acoustic wave launched by a transducer is a perfect replica of the electric wave applied to the launching transducer; and, a plurality of acoustic waves propagating in the same medium have no effect on each other, the combined effect of the waves being sensed electrically, and resulting only from the relative propagation delay of the particular components of the waves being sensed by the transducers. This permits processing of the waves in different discrete portions, or channels, of the same medium, which in turn permits providing varying propagation delays to the respective portions of the waves being processed.

According to the present invention, a surface acoustic wave signal processor has a plurality of segmented-transducer ports, each segmented-transducer port including a plurality of discrete acoustoelectrical transducers for providing coupling between electric signals of the ports and acoustic waves in a plurality of corresponding independent wave propagation channels extending along a preferred direction of acoustic wave propagation within the surface of a piezoelectric substrate, the transducers of each segmented-transducer port being electrically in common and spaced at successively different distances along the direction of propagation of the substrate.

In accordance with the present invention, the taps and other transducers of a SAW signal processor extend across the surface of the SAW substrate in a direction perpendicular to the propagation direction, with different relative spacing between segments of one of the transducers and the taps, and segments of the other transducers and the taps. In accordance with the present invention, two dimensional, signal combining SAW signal processing allows the launching or receiving of discrete portions of the waves related to each particular tap at independently-determinable propagation-delay distances from an interaction tap.

The invention provides two dimensional processing in the sense that one dimension is the usual distance along the direction of propagation which introduces the desired acoustic wave delay between particular acoustoelectric transducers, the other dimension being the subdivision of the waves into discrete portions or chips to as to permit variations in the delays within the first dimension on a portion by portion (or chip by chip) basis.

The present invention permits a wide variety of SAW interrelationships. The relationship between each wave and the individual taps is independent of the relationship between another wave and corresponding taps, subject only to the inherent processing phase requirements of a SAW signal processor. The invention provides signal processing combinations, including series-parallel signal processing, which have not heretofore been available in the art. The invention provides tap performance which is uniform to approximately ±1dB or better. The invention provides significant reduction in wave absorption and reflection which have attended signal combining SAW processors known to the art; suppression of undesired spurious electric and acoustic signals, on the order of 55dB is readily achieved.

Other objects, features and advantages of the present invention will become more apparent in the light of the following detailed description of exemplary embodiments thereof, as illustrated in the accompanying drawing.

DETAILED DESCRIPTION

Figure 1:
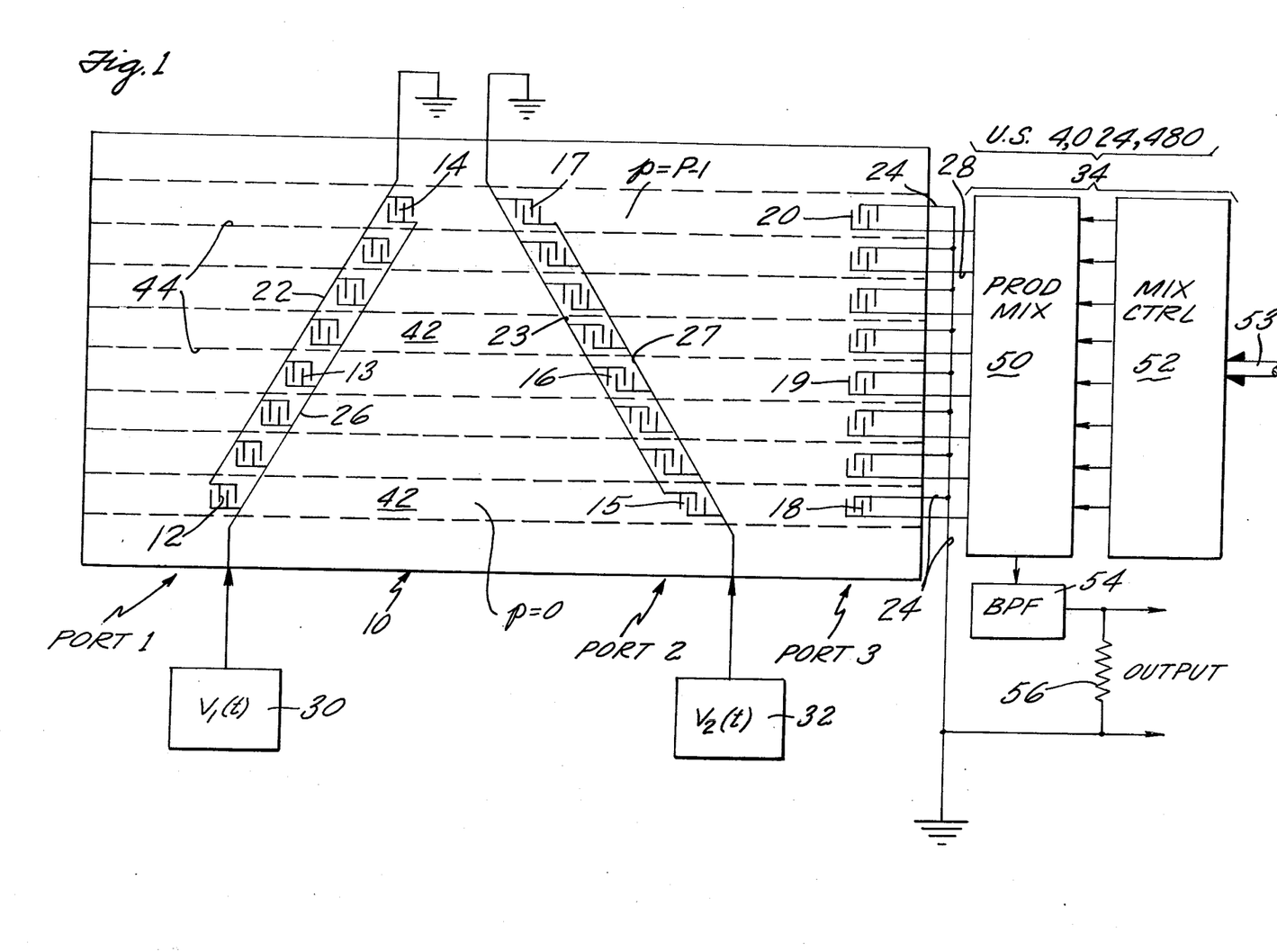
FIG. 1 is a schematic block diagram of the general principals of the present invention, in a configuration particularly well suited for convolution and discrete Fourier transform operation.

Referring now to FIG. 1, one embodiment of the improved surface acoustic wave (SAW) signal processor according to the present invention includes a substrate 10 of piezoelectric material, such as Y-cut lithium niobate, which (as is known) provides a combination of strong piezoelectric coupling with low acoustic propagation loss and large time delay per unit of length. The material may alternatively comprise YZ-cut quartz or other piezoelectric materials as is known in the art. The substrate 10 has a principal surface on which there is disposed metallic conductors formed as thin films in accordance with well known metallization techniques utilized in integrated circuit manufacturing. The conductors on the substrate surface are disposed to define a plurality of acoustoelectric coupling transducer segments 12-20, interconnected in groups so as to form respective ports (Port 1, Port 2, and Port 3 being illustrated). The segments 12-14 and 15-17 are electrically in common, while the segments 18-20 are independent, and comprise the taps of Port 3. In a simple configuration, one side of each of the segments and taps 12-20 may be connected by suitable conductors 22-24 to ground or other reference potential, and the other side of the segments and taps 12-20 may be connected by similar suitable metallized conductors 26-28 to external signal circuitry, such as input signal sources 30, 32 or product summation mixers and controls therefor 34. Although not illustrated herein since it is well known and shown in the aforementioned Reeder and Gilden patent, absorption means may be appropriately placed to the left of Port 1 as seen in FIG. 1, and to the right of Port 3 as seen in FIG. 1, to minimize wave reflections in the substrate. And the transducers are, as shown, oriented for coupling with waves traveling in the preferred direction, along the channels.

Concerning the operation of the improved SAW signal processors of the present invention having separate, parallel acoustic channels, it is assumed that the channels will be aligned with a pure mode direction (providing one pure Rayleigh wave per transducer) which is referred to herein as the preferred direction of propagation. Such would occur, for instance, if the channels were along the crystal Z-direction in a Y-cut lithium niobate substrate.

Figure 2:
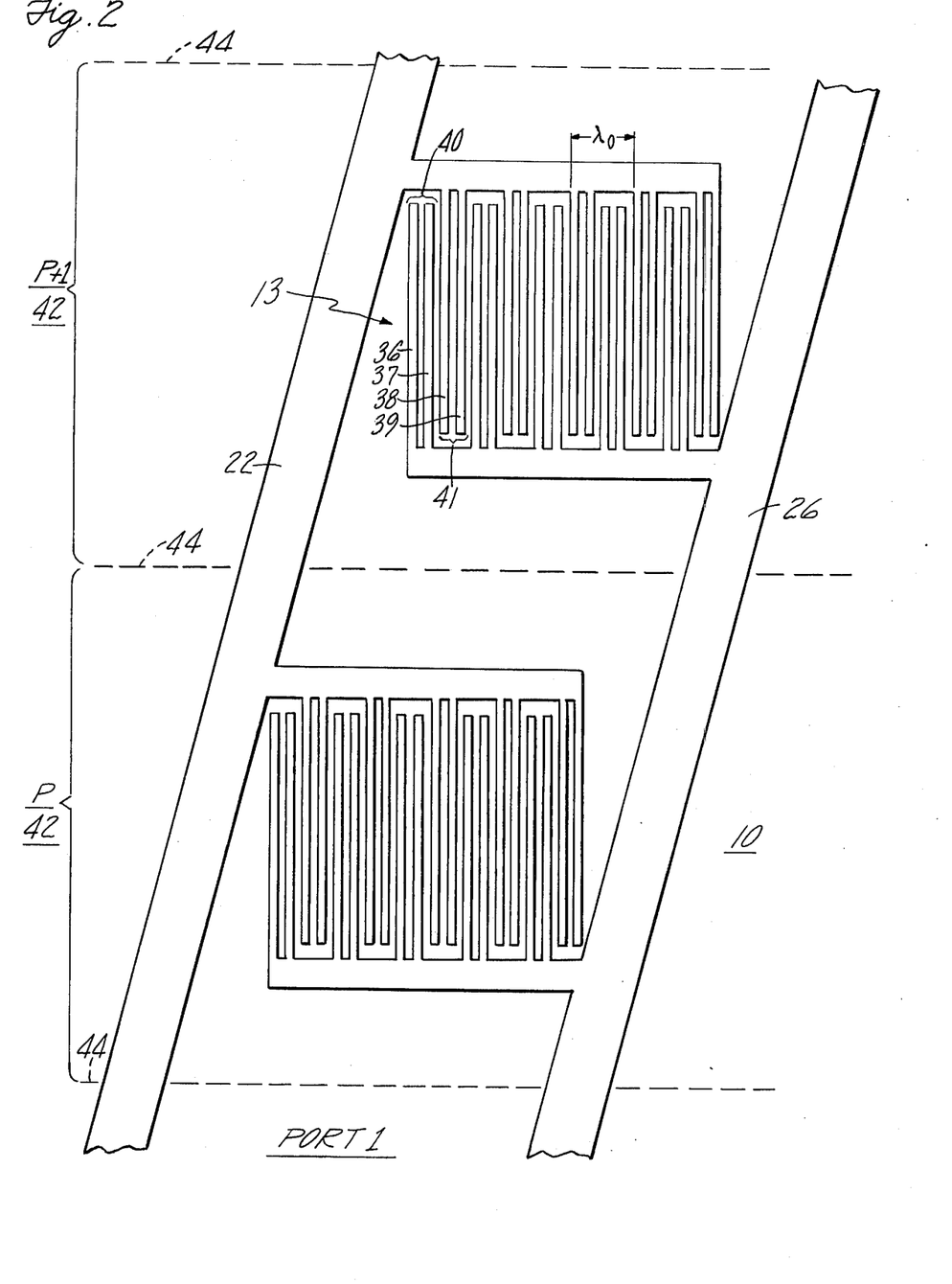
FIG. 2 is a partial, detailed plan view of acoustoelectric coupling transducers of the type utilized in the embodiment of FIG. 1.

Each of the transducer segments 12-17 and taps 18-20 may be of the common interdigital form, the segment 13 being illustrated more particularly in FIG. 2, consisting of a plurality of fingers 36-39 arranged in pairs 40-41, alternative pairs being respectively connected to the metallized conductors 22 and 26, respectively. The longitudinal extent of fingers 36-39 is transverse to the direction of propagation; the direction of propagation is along P channels 42, identified as $p = 0$ through $p = P-1$, and separated by dotted lines 44 in FIGS. 1 and 2. As is known in the art, this configuration, referred to commonly as an interdigital acoustoelectric transducer, may include on the order of ten finger pairs, five pairs respectively connected to each of the conductors 22, 26, as is illustrated in FIG. 2.

Each finger may be on the order of ⅛ of a wavelength ($\lambda_o$) of the preferred strain wave to be propagated in the substrate, which is chosen in accordance with the characteristics of the substrate (which generally has a quite broad frequency characteristic). Each of the fingers may be separated by a space which is also ⅛ of a wavelength, so that the spacing between commonly-connected like pairs is one wavelength as illustrated in FIG. 2. The other dimensions are not at all critical, but may vary broadly. For instance: the length of the fingers may be on the order of 10-100 wavelengths; the metallization connecting the finger ends may be on the order of one to two wavelengths wide; and the conductors 22 and 26, may be something less than 10 wavelengths (to keep the attenuation small while at the same time having the current capability to drive the transducers connected thereto). The overall length of each transducer (the 10 finger pairs shown in FIG. 2) will, under the previous constraint, be an integral number of wavelengths long. On the one hand, the fewer finger pairs, the lower the coupling efficiency to some extent; but, bandwidth is always less than the frequency, or average frequency, of the electric signal driving the transducers, divided by the number of strain wave wavelengths included in the transducer along the direction of propagation. Thus, fewer fingers in each transducer result in a higher bandwidth. A balance between bandwidth and coupling efficiency, therefore, is to be achieved in accordance with the design parameters of any particular utilization of the invention, as is all known in the art. The spacing between transducer segments transversely of the direction of propagation (the spacing between the ($p$)th and the ($p+1$)th transducer) is widely variable, and may be on the order of 10-100 wavelengths. In fact, only sufficient spacing need be required so as to reduce interchannel coupling to a tolerable level.

In SAW signal processors of the type illustrated herein, each port may contain a wide variety of numbers of transducer segments or taps; for utilization of SAW signal processors with digital computers, the number of taps (therefore the number of channels) may preferably be a power of two, such as 32, 64, 256, etc. For larger numbers of channels, the transducer segments might not be connected purely in parallel as is illustrated in FIGS. 1 and 2, but may have semiconductor amplifiers disposed to drive parallel-connected groups, each group in turn being connected in parallel to the circuitry external of the substrate. In such case, of course, care must be taken to dispose the semiconductor amplifiers and the increased metallization required for additional conductor paths in a fashion to minimize strain wave absorption and reflection (as is known in the art), and particularly to minimize variations therein.

Referring again to FIG. 1, although the configuration is different in accordance with the present invention, the general principals of diode coupled SAW signal processing useful with the invention are disclosed in the aforementioned Reeder and Gilden patent. And, the principals of programmable product summation, in which the mixers can be programmed to respectively provide varying mixer efficiency constants (gain) and phase relationships, are fully disclosed in the aforementioned Reeder and Grudkowski patent. Although illustrated in the embodiments herein as including the programmable mixers and mixer control 34, of the type illustrated in the Reeder and Grudkowski patent, the principals of the present invention are, as should be apparent, equally applicable when simple diode coupling of the type described in the Reeder and Gilden patent is employed, or when simple linear mixing is employed. Therefore, the product mixer and control circuitry 34 herein may in fact consist of product mixers 50 which are selectively programmable to either be all alike, or to have varying gains, or to have varying phases, or combinations of varying phase and gain, as programmed by a mixer control 52, in response to signals provided thereto on lines 53. The corresponding outputs of the product summation mixers 50 are serially combined and passed through a bandpass filter 54 so as to provide an output at a load 56 which is the desired combination of signals accomplished by signal processing, typically at the difference carrier frequency resulting from heterodyning of the signals in the product summation mixers. But, when the programming provided by the mixer control 52 is for uniform mixer efficiency and phase, then the apparatus 34 functions in the same fashion as the simple diode coupling of the Reeder and Gilden patent referred to hereinbefore. In any event, the basic principals of the present invention relate to the discrete processing channels and the increased processing dimensions achieved thereby, rather than to the particular manner of using or controlling the device. Examples of control and utilization of the present invention are presented in conjunction with Appendices 2-5 hereinafter.

As is known and described more fully in the aforementioned Reeder and Gilden patent, the function of convolution is achieved by taking the product summation of successive elemental portions of two signal waves, where one of the signal waves is fed in a time reversed fashion with respect to the other of the signal waves. It is thus apparent that the embodiment of FIG. 1 is well suited to convolution, since time reversal of one of the waves applied to Port 1 or Port 2 with respect to the other of the waves, is automatically achieved by the transducer arrangement of the respective ports. And, by applying a time-reversed wave to either Port 1 or Port 2, correlation is equally well performed. The configuration of the present invention illustrated in FIG. 1 comprises a plurality of ports (Port 1, Port 2, Port 3) each of which has a plurality of acoustoelectric transducers (12-14, 15-17, 18-20) each of the transducers corresponding to a related, independent propagation channel 42, the transducers (14, 17) of at least one of the ports (Port 1 or Port 2) each having a different propagation delay, with respect to a corresponding transducer (20) of at least an additional port (Port 3), than do other transducers (13, 16, 19) of the respective ports. The slope of the transducer arrangement in FIG. 1 is not critical; that is, the spacing between transducers 14 and 17 in contrast with the spacing of transducers 12 and 15 is not critical; but the sharpness in time of the convolution function will be increased as the propagation time diversity increases (that is, as the difference in spacing between the transducers 12 and 15 becomes increasingly greater than the spacing between the transducers 14 and 17). And, conversely, when the two ports have nearly identical transducer spacing, the correlation function is poor, and very broad in time. The arrangement illustrated in FIG. 1, where the slopes are equal and opposite, does not, therefore, imply any particular propagation delay increment, on a channel by channel basis, in either of the ports.

Figures 3, 4, 5, 6:
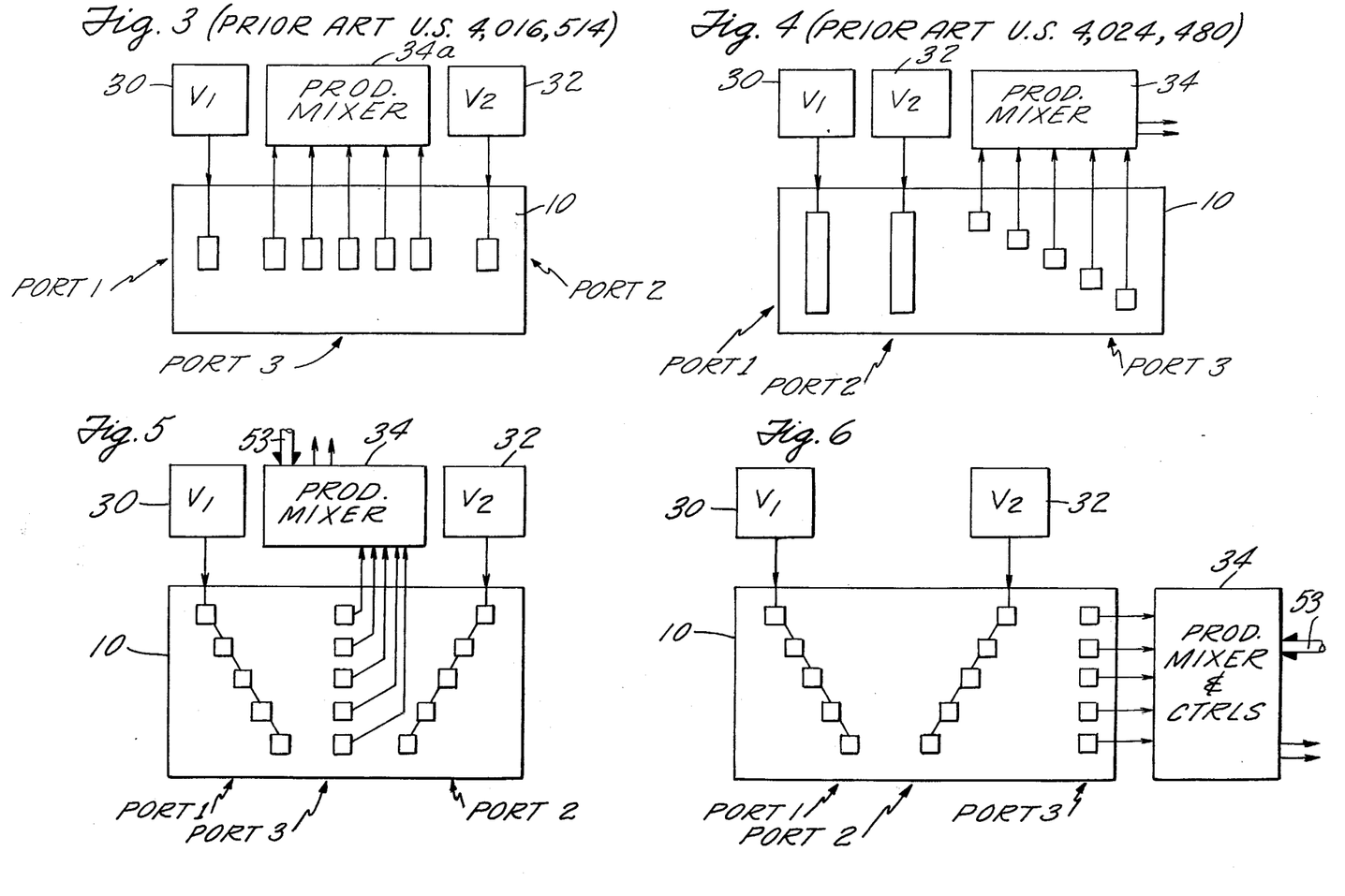
FIG. 3 is a simplified, schematic illustration of the configuration of the aforementioned Reeder and Gilden patent.
FIG. 4 is a simplified schematic illustration of the configuration of the aforementioned Reeder and Grudkowski patent.
FIG. 5 is a simplified schematic illustration of the present invention in a comparative form.
FIG. 6 is a simplified schematic illustration of the present invention in a preferred form.

The configuration described thus far with respect to FIGS. 1 and 2 is illustrated more simply along with configurations of the aforementioned patents, for comparison purposes, in FIGS. 3-6 which are simplified in that the small squares shown on the surface of the substrate 10 are to be understood as being suitable acoustoelectric coupling transducers of the type described hereinbefore with respect to FIGS. 1 and 2. For simplicity, the following description of FIGS. 3-6 will assume that the processing port including the taps, connected to product mixers, is the receiving or interaction port (identified in these figures as Port 3) and Port 1 and Port 2 are wave launching ports. However, it should be understood as is described in the aforementioned patents and hereinafter, that Port 3 may be utilized for launching a wave and either Port 1 or Port 2 may be utilized as a receiving, interaction port, if desired. Referring to FIG. 3, the configuration of the aforementioned Reeder and Gilden patent includes a pair of launching ports (Port 1, Port 2) on opposite ends of the interaction region which includes a plurality of electrically-independent transducers comprising the taps of Port 3. In this case, the taps are applied to nonprogrammable product mixers 34a. It is thus apparent that there is but a single acoustic wave channel, regardless of its width, which extends between Port 1 and Port 2, with Port 3 arranged as a serially-aligned sequence of taps therebetween.

In FIG. 4, the configuration disclosed in the aforementioned Reeder and Grudkowski patent is shown to include Port 1 and Port 2 on the same side of the interaction region, and the individual taps of Port 3 being laterally displaced to some degree so that wave components corresponding to each of the taps do not necessarily pass under all of the taps. This is the well known "tilted-tap" configuration, which is utilized to reduce the spurious signal generation resulting in part from reflections and absorptions of the waves by the respective taps. This configuration also has but a single propagation channel; it is, however, wide enough to allow tilting of the taps.

In contrast, the present invention is disclosed in a general fashion in FIG. 5. Therein, the discrete taps of Port 3 are arranged transversely of the direction of propagation; Port 1 and Port 2 consist of individual transducer segments which are similarly displaced laterally across the substrate, on a one-to-one basis with the taps of Port 3, with different spacings from the segments along the direction of propagation. As illustrated in FIG. 5, the segments of Port 1 have a linear incremental displacement along the direction of propagation with respect to each other, which is opposite but equal to the linear incremental displacement along the direction of propagation of the transducer segments of Port 2. By comparing the configuration of FIG. 5 with that of FIG. 3, it becomes apparent that an essential aspect of the present invention is to provide the taps of Port 3 arranged for parallel operation with corresponding transducer segments of Ports 1 and 2, in contrast with the prior art where the relationship is purely serial in time. The configuration of FIG. 5, although within the present invention, has a practical disadvantage of having to connect with the electrically-independent taps of Port 3 across the top of the interaction region; therefore, the electrically-independent taps of Port 3 are preferably disposed at an edge of the substrate, as in FIG. 1, illustrated for comparison purposes in FIG. 6.

Figure 7:
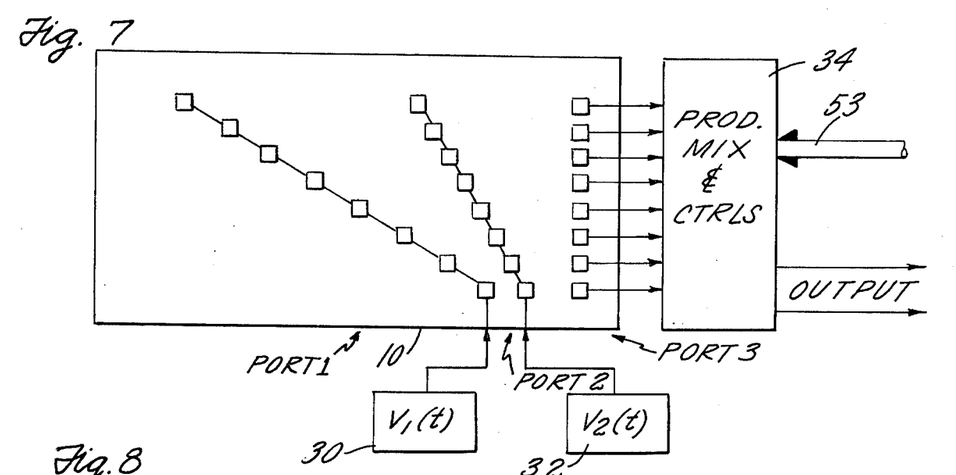
FIG. 7 is a simplified schematic illustration of a further embodiment of the invention, particularly suited for correlation operations.

Another configuration of the present invention is illustrated in FIG. 7. Therein, the transducer segments of Port 1 are disposed on the surface of the substrate 10 with a greater propagation delay increment from one channel to the next than are the transducer segments of Port 2. This configuration is particularly well suited to correlation functions in which the instantaneous product of two waves is taken at Port 3, both waves being launched in forward time relationship (unlike the reverse time relationship of convolution), as is known in the art. The different increments of tranducers for Port 1 and Port 2 are required in order to ensure that there is but a single point in time when the waves launched by Port 1 and Port 2 are, on a per channel basis, in phase with each other at the transducers of Port 3; but this requires that the wave launched on the port having a greater acoustical delay increment per channel (Port 1 as seen in FIG. 4) be expanded to have twice the time base of the wave launched at Port 2 (or vice versa), and that it be launched such that the two waves are centered about the same point in time. If both of the ports had the same propagation delay increment as between channels of successive ports, they would be in phase with each other at all times at Port 3, rendering it impossible to perform the correlation function. The time compression of the wave to be applied at Port 3 or expansion of the wave to be applied at Port 1 can be achieved with a similar device which is simply launched on an appropriately configured SAW processor having at least two ports, with a requisite propagation delay increment, between corresponding segments and taps, from one channel to the next, and gating the taps at one point in time so as to capture the time-adjusted wave. On the other hand, any techniques known to the art, including purely electronic (non-SAW) techniques may be utilized as is appropriate to accommodate the time relationship for correlation utilizing a configuration of the type shown in FIG. 6. In a fashion described with respect to the embodiment of FIG. 1 herein, the configuration of FIG. 7 does not require any particular differential per channel increment as between Ports 1 and 2, the correlation however becoming sharper if the increment difference is greater, and reducing to zero when they are the same (as described hereinbefore).

Figure 8:
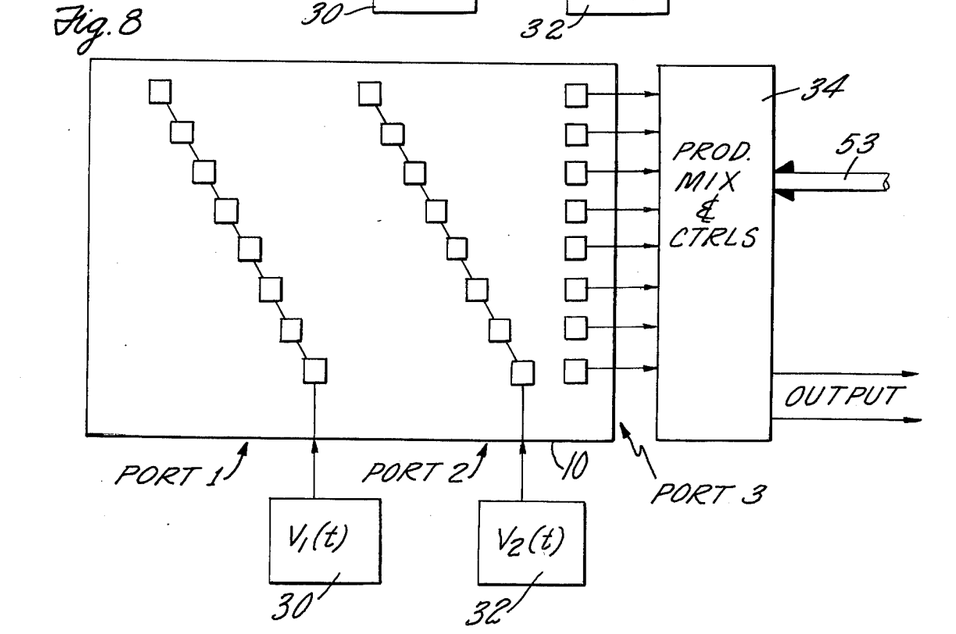
FIG. 8 is a simplified schematic illustration of another embodiment of the invention, with identical spacing of port segments, particularly suited for programmable transversal filter operations.

In the configuration of FIG. 8, both ports have identical per channel increments of acoustic wave delay; this configuration is particularly well suited to utilization as a general transversal filter of a type disclosed in the aforementioned Reeder and Grudkowski patent. In such case, one of the ports simply has a carrier wave applied thereto where the other port has a frequency modulated carrier wave applied thereto, and a parallel input is provided to control the amplitude and/or phase of the product mixers, in the same fashion as described in the aforementioned Reeder and Grudkowski patent.

For generality, there is illustrated in FIG. 8 a configuration in which the acoustical delay spacing of the transducer segments of Port 1 is not constant, but has a linear increase therein. And, the spacing of the transducer segments of Port 2 is shown to be nonlinear and diatonic, for exemplary purposes only. As with all new devices, the manner in which the present invention may be utilized has not been fully explored; it suffices to understand that the two dimensional processor in accordance herewith opens up new dimensions for processing, particular configurations and resulting utilizations of which will evolve as practitioners become familiar with this new processor and find ways to adapt it to their particular needs.

With any of the configurations, more complex functions can be performed (as is described with respect to the discrete Fourier transform hereinafter) by applying two waves serially in Port 1 and Port 2, and a third wave in parallel in the program controls of the product mixer and controls 34, a dimension which is not achievable in any SAW signal processors known heretofore. In fact, additional ports (similar to Port 1 and Port 2) may be provided, as should be obvious to those skilled in the art; however, the examples of the type of processing which would therefore be involved become unduly complex and are not necessary for an understanding of the present invention, which is the provision of the independent channels with the attendant increased dimension of processing and reduction of signal attenuation and reflection, and dispersity therein. For instance, an additional port having no propagation delay increment on a channel by channel basis (similar to Port 3 in the configurations of FIG. 1) may be provided in the configuration otherwise the same as FIG. 1, to launch a wave, the Fourier transform of which is desired, utilizing identically programmed product mixers at Port 3 for simply providing the product summation of the three serially-launched waves, if desired. This utilization, and others of varying complexity, should be apparent to those skilled in the art from the foregoing descriptions of a variety of configurations, and the ensuing discussion of the operation thereof.

In the following description, a channel by channel analysis of the three ports utilizes subscripts 1, 2 and 3 to denote the respective ports, and "$p$" relates to the individual ones of the P separate channels with respect to each port. References are made to the equations, which are set forth in the appendices. The appendices are not separately identified since each equation is uniquely numbered, without regard to the particular appendix in which it appears. The primary discussion is with respect to the general operation of devices of the type described herein, which is in conjunction with equations 1-18 of Appendix 1. Subsequently herein, various operations are described with respect to Appendices 2-5. As an aid in the following discussion, brackets of the form ( ) are used to denote functional dependence such that V(t) denotes voltage as a function of time, etc., or in the usual context of simply grouping of parameters. Brackets of the form [ ] are used simply for the normal grouping of parameters, and brackets of the form { } denote the separation of the frequency modulation or video portion of a wave and its carrier as is shown in Equation (1).

The transducer segments and taps associated with each of the three ports are capable of efficient, inherently highly-linear excitation of surface acoustic waves on a piezoelectric surface. Thus, a voltage waveform which is a function of time will induce a strain wave as a substantially identical function of time; the strain wave will, however, propagate along the surface such that the instantaneous phase in space and time of the strain wave at any point along one of the channels will be both a function of time and a function of the distance along the channel from the launching transducer. Since major applications of surface acoustic wave signal processors employing the present invention may utilize product detectors for combining surface acoustic wave signals, the following analysis assumes frequency modulated waves having video modulation impressed on a carrier. Thus, assume that waves of the form expressed in Equations (2) and (3) are applied equally to each of the $p$ transducers of Port 1 and Port 2, respectively. The strain waves excited in the $p$th channel in respective response to these two input waves will be of the form expressed in Equations (4) and (5), respectively. Equations (4) and (5) illustrate that the instantaneous magnitude of the strain wave in the $p$th channel is a function of both time and the distance, Z, along the channel from the launching transducer. In Equations (2) and (3), the term $K_1(\omega_1)$ is a frequency dependent coupling constant related to the transducer electrode configuration and the acoustic parameters of the substrate. In most practical cases, having chosen a frequency range (generally on the order of 100 MHz to 200 MHz), these factors may be assumed, in most practical cases, to be nearly independent of frequency, and therefore constant.

In Equation (4), the second term is a video term which illustrates how the modulation $V_1(t)$ in the $p$th channel becomes also dependent on the relative offset time delay between the transducer segments of the particular ($p$th) channel and the transducer segments of a reference channel, such as the $p = 0$ channel; and, at any point in the channel, the video is also dependent upon the time for the wave to propagate to that point in the channel which is expressed as the distance ($z$) divided by the velocity ($v$).

In Equation (4) the last major term is the carrier, in which the wave resulting from the original carrier $\{\exp[j\omega_1 t]\}$ (which, as known, is equivalent to the form $\{e^{-j\omega_1 t}\}$) is dependent upon the offset of the transducer for the related channel, and the time of wave propagation along the Z-direction of the substrate (as described with respect to the video hereinbefore).

As described briefly hereinbefore, Port 3 includes a plurality of independent taps, one for each of the P separate channels, each connected to a separate, corresponding RF frequency product mixer. The output of each product mixer is the vector product of the video, at the sum and difference frequencies of the carriers, of the electric waves induced in the corresponding transducer by the two strain waves propagating in the related channel of the substrate; as before described, these electric waves will very accurately reflect the time dispersed strain waves as they propagate past the tap. The product summation at the sum frequency ($\omega_1 + \omega_2$) is expressed in Equation (6), and the product sum at the difference frequency ($\omega_2 - \omega_1$) is expressed in Equation (7). The video of the two signals differs since the product video at the difference frequency $V^*_1(t) = e^{+j\omega_1 t}$ includes the conjugate of the Port 1 video input $V_1(t) = e^{-j\omega_1 t}$ which appears in the product video at the sum frequency. Similarly, the mixer efficiency constant $g_s$ for the sum frequency product summation may be different for the mixer efficiency constant $g_d$ for the difference frequency product summation. These mixer efficiency constants are determined by the fixed parameters of the mixers as well as the adjustable DC mixer bias applied thereto. These constants may be thought of as representative of transfer characteristic or gain.

A complete discussion of mixer characteristics which are applicable herein is given in Tucker, D.C.: *Circuits With Periodically Varying Parameters,* Chapter 3; Van-Nostram, New York (1964).

Assuming that the transducers of Port 3 are all disposed at $z = z_o$ and assuming that the bandpass filter 60 is chosen to pass the difference frequency of the product summation, the serial product output thereof may be expressed as in Equation (8), where: $A = K_1(\omega_1)K_2(\omega_2)$ is assumed independent of the channel ($p$) and of the frequencies ($\omega_1, \omega_2$), and therefore a constant; $t_o = z_o/v$ is the wave propagation time from a reference point $z = o$ to the Port 3 transducers at $z = z_o$; and $g_p$ is the mixer efficiency constant (for the frequency difference product summation) of the mixer in the $p$th channel.

This expression can be simplified by consideration of certain characteristics involved in the operation of practical devices. Since each of the transducer segments relating to each channel for each port must be oriented along the Z-direction in order to propagate the wave in the Z-direction, the time delay factors due to wave excitation from the discrete channel-related transducers for each Port 1 and Port 2 must have a simple, stepped relationship vs. channel number ($p$), commensurate with the stepped physical arrangement of the transducers. (But, this need not be uniform, linear, or monotonic in the general case.) Defining $t_o$ as a reference time related to the taps of Port 3, and $t_{1o}$ as the time of launching from the Port 1 transducer segment of the $p = o$ channel, then the propagation time from the transducer segment of the $p = o$ channel of Port 1 to the corresponding transducer segment at Port 3 is $t_o - t_{1o}$. Defining $a_p$ as an adjustable, dimensionless factor which defines the variations in actual time increment between the $p$th channel and the $(p + 1)$th channel the incremental delay from one channel to the next can be expressed as $a_p \Delta T$, where $\Delta T$ is a nominal, or basic intersegment time delay for the entire device. Thus, with respect to channel 1, the time of launching the wave from each transducer segment of a channel may be expressed as in Equation (9). And, the time delay factor between each channel-related transducer segment of Port 3 may be expressed as in Equation (10).

As is known in the prior art, the effect of constant propagation time delays in a SAW device can be completely compensated for by use of external video delay generators. By rearrangement as shown in Equations (11) and (12), the time delay factor can be considered to be made up of a constant delay (which relates to the average distance between Port 1 and Port 3) which may be compensated for by external video delay (Elec $\phi$) plus the particular channel delay ($p\ a_{1p}\Delta T$) for each channel of Port 1. Assuming such external video delay to be provided, Equation (7) may be simplified by the relationship of Equation (13) which follows from Equation (12), and a similar relationship for Port 2, to provide the simplified relationship of the output of the bandpass filter for the difference frequency product summation as set forth in Equation (14).

Figure 9:
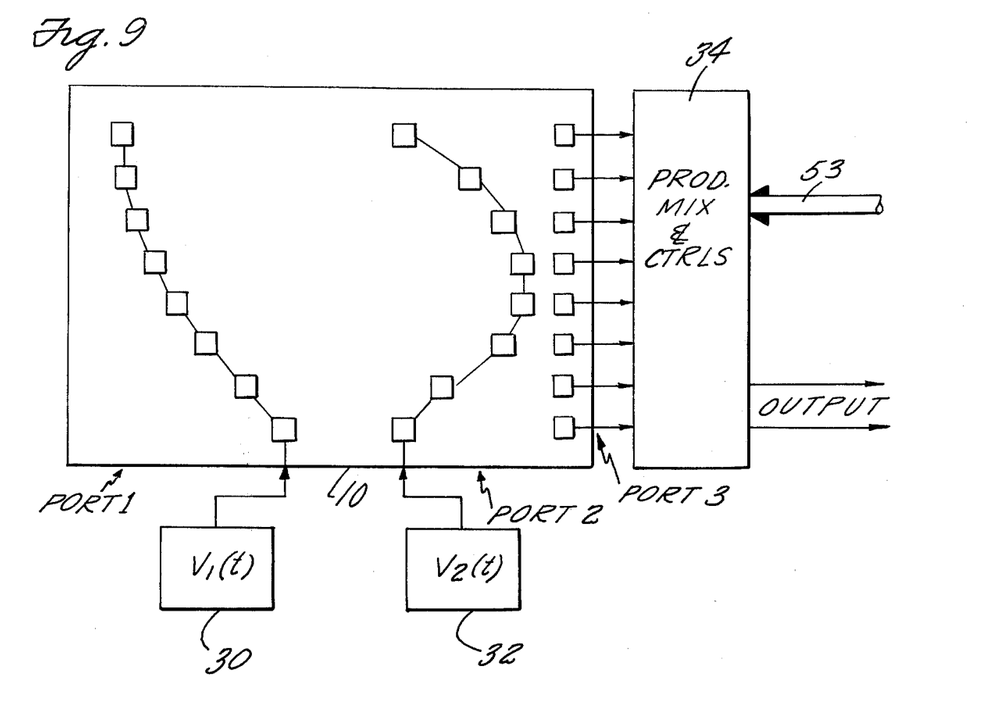
FIG. 9 is a simplified schematic illustration of the present invention in a generalized, exemplary form with various port segment spacing.

With some further assumptions, the expression of Equation (14) can be further simplified. First, as is known in the art, the heterodyning of the RF product mixers, and use of a bandpass filter to select the difference frequency, leaves only the difference frequency as set forth in Equation (15); and, as is known, the summation of the single carrier frequency $\omega_3$ will reduce to a constant so that all of the carrier terms may be taken outside the summation. Second, to ensure that maximum output is developed at Port 3 when the processor is used for correlation and the like, the carrier frequencies ($\omega = 2\pi f$) are chosen along with the dimensionless channel increment factors ($a_{1p}, a_{2p}$) for phase synchronism at the mixer taps of the interaction port (Port 3) of all P channels, as set forth in Equation (16), where N is an integer. Thus, the carrier frequencies of the waves launched by the two ports must relate in a fashion illustrated in Equation (17). If desired, the integer N may, more generally by $pn$; in other words, the frequency relationship of Equation (17) need only be true on a channel by channel basis in the general case. Third, as in the embodiments in FIGS. 1 and 5–7 hereinbefore, the dimensionless channel increment factors $a_{1p}, a_{2p}$ may be constant for the transducers of Port 1 and constant for the transducers of Port 2, respectively, such that $a_{1p} = a_1$; $a_{2p} = a_2$. With these simplifying factors, Equation (14) reduces to a simpler expression as in Equation (18), which is the general expression for operation of the devices described with respect to FIGS. 1 and 5–8 hereinbefore, with the constant time delay increments compensated for by external video delay, a bandpass filter chosen to select the difference frequency, constant steps in each of the ports, and phase synchronism in the channels. The constant step assumption will not, of course, apply to a generalized configuration, such as that illustrated in FIG. 9.

The expression of Equation (18) represents an extremely general form of serial product summation. Obviously a corresponding expression exists when the bandpass filter is chosen for the summation frequency; however, the examples herein have been chosen for the difference frequency since in practical RF devices, it it generally easier to process the difference frequency than the much higher sum frequency; and, since the expression is completely analagous, it is not developed herein.

A SAW signal processor operating in accordance with the expression of Equation (18) can be used in several different ways. For instance, the inputs, both known and unknown, can be serially launched acorss the channels by application to Port 1 and Port 2; in this case, the combinatorial result appears at the outputs of the mixers of Port 3. And this result may be further raised by a third input applied to program the mixers ($g_p$, in Equation (18)). On the other hand, one of the waves (either known or unknown) may be applied to either Port 1 or Port 2 for serial input, and another wave may be applied in parallel to Port 3; in such case the combinatorial output will be provided at the other one of Port 2 or Port 1, respectively.

Considering a first specific application of the present invention for signal convolution, the embodiment described with respect to FIG. 1 may be utilized with the transducer segments of Port 1 and Port 2 having constant, and equal but opposite increments along the Z axis from one segment to the next, as expressed in Equation (19). With this constraint, Equation (18) reduces to the expression of Equation (20), which is the weighted serial convolution. Assuming $g_p$ to be constant (that is, all of the product mixers having the same efficiency constant or gain) Equation (20) expresses, in an equivalent form, the unweighted serial product convolution of the type known in the art, as is disclosed in the aforementioned Reeder and Gilden patent. As in the aforementioned patent, this type of convolution operation is effected in an output time scale which is reduced by a factor of two, due to the fact that convolution shifts are caused by both of the input waves which are both traveling, each having incremental time shifts. Of course, Equation (20) describes relationships which can be of even further complexity if the product mixer efficiencies ($g_p$) are not held constant; however, in view of the complexity and the lack of an immediately-apparent realworld utilization therefor, this further degree of complexity is not described further herein. Of course, time reversal of one input will permit performance of correlation functions in this configuration, as described in the Reeder and Gilden patent.

A device of the present invention, operationg in accordance with Equation (18), with certain constraints, can also perform signal correlation directly. As described hereinbefore with respect to FIG. 7, since signal correlation can be provided only if the two waves launched at Port 1 and Port 2 will be totally in phase across the $p$ channels at the taps of Port 3 only at one point in time, the transducer configuration for Port 1 must be different from that of Port 2. In FIG. 7, the configuration is shown with Port 1 having greater incremental time delays across the $p$ channels than Port 1. In fact, the special case of Port 1 having twice the delay of Port 2, as expressed in Equation (21), is useful since it permits a 2:1 time compression of the wave applied to Port 1 so that commensurate time scales are achieved at Port 3. Of course, as long as appropriate time scales can be provided, the relationships between $a_1$ and $a_2$ can be chosen in any manner to suit any particular implementation of the present invention. A 2:1 time compression can be effected by passing one of the signals through suitable SAW devices, digitally by chips, or otherwise as known in the art. With the configuration of FIG. 7 and the constraint of Equation (21), the general expression of Equation (18) becomes the expression of Equation (22), which is seen to be an equivalent form of the correlation function.

Yet another function which can be performed with apparatus in accordance with the present invention is that of a programmable transversal filter. This function is described in depth in the aforementioned Reeder and Grudkowski patent. For this function, the embodiment of FIG. 8 may be used, in which Port 1 and Port 2 have the same channel to channel increment of transducer spacing, as is illustrated in Equation (23). And, the input to either one of Port 1 or Port 2 need be simply a carrier in order to provide heterodyning required for operation of the product mixers; so, the input to Port 1 can be a pure carrier wave as is expressed in Equation (24). Under these circumstances, the general expression of Equation (18) reduces to the expression of Equation (25) which is an expression for a general transversal filter having tap weights $g_p$. In accordance with the aforementioned Reeder and Grudkowski patent, both the sign and the amplitude of the mixer efficiency constants, $g_p$, can be electronically programmed through the inputs 53, resulting in an extremely versatile type of frequency filter. This may be used, as is known, to provide variable bandpass/bandstop filtering, as well as amplitude/phase code matched filtering. This device operates in a series-parallel mode in that the input to Port 2 is serial, whereas the filter tap weights, as inputs to the mixers, are applied in parallel.

The present invention is uniquely capable of performing discrete Fourier transform operations. Considering again the configuration described hereinbefore with respect to FIG. 1. For this usage, the configuration of FIG. 1 will have equal and opposite, unity transducer segment spacing increments, so that: $a_{1p}=a_1=1$, and $a_{2p}=a_2=-1$ (or vice versa). Then, assume that the inputs to Port 1 and Port 2 are identical FM chirp waveforms having a bandwidth B and a chirp duration T as defined in Equation (26). These input waveforms may be of the form represented in Equation (27). Applying these inputs to Equation (18) while allowing $a_1=1=-a_2$, the general expression for operation of devices in accordance with the present invention set forth in Equation (18) reduces (after significant yet straightforward mathematical manipulation) to the expression shown in Equation (28). If the output of Port 3 is sampled at times $t_m$, which are related to the bandwidth of the input chirps as set forth in Equation (29), the expression further simplified to that set forth in Equation (30). This is recognized as one form of a known expression of a discrete Fourier transform of the mixer coefficients $g_p$. If the mixers are designed so that their mixer efficiency constants are linearly related to corresponding chirps $V_p$ of an external, parallel-input potential $V(p)$, such that $g_p = KV_p$, then Equation (30) is altered to the expression set forth in Equation (31), which is the discrete Fourier transform of the parallel input $V_p$. As far as is known, this capability is unique in SAW signal processors, any other capability for performing the discrete Fourier transform requiring complex additional circuitry, as is disclosed with respect to FIG. 6 of the aforementioned Reeder and Gilden patent, or being precluded by the practical physical constraint of purely serial taps, as described hereinbefore.

Thus there has been described a plurality of configurations of the present invention, and some of the immediately-apparent uses to which it may be put. However, it should be understood that the invention, in its simplest sense, is in providing a plurality of processing channels in a SAW signal processor, with each channel having at least three acoustoelectric transducers therein, so as to provide independent time delay characteristics between three separate ports, each port having transducers in each of the channels. As shown herein, Port 1 and Port 2 comprise electrically interconnected transducer segments such that the wave applied to the port is launched or received in an incremental time fashion by each of the transducer segments of the port; and Port 3 is illustrated as having electrically independent ports such that the waves launched or received thereat are combined or related only in circuitry attached thereto, rather than by direct electrical connection therebetween. However, the invention may find practical utility (in a manner not currently appreciated) by causing the transducers of two of the ports to be electrically independent (such as is Port 3) while only one of the ports has the transducer segments thereof electrically connected. In such a case, the electrically independent ports would most conveniently be provided at opposite ends of the substrate so that the electrical connections thereto would not appear across the channels over the processing region; however, none of the ports need be arranged in a straight line if not desired, and even in the configuration of FIG. 1, Port 3 may have other than a fully lateral alignment of the individual acoustoelectric transducers 18–20. Similarly, the spacing of the ports can be widely different from each other, each port being capable of equal increments; nonequal linear increments; nonequal, nonlinear increments; or any configuration for which a use can be found. And it is to be understood that the present invention is intended for a number of uses which may not at present be apparent, but which the appearance of this invention will bring forth.

Although disclosed in the general sense as being useful with the programmable product mixers of the type described in the aforementioned Reeder and Gurdkowski patent, it should be clear that the invention consists of the surface acoustic wave signal processor module itself, consisting of the substrate 10 and the matallization thereof; the use of such a module inherently requires interconnection with circuitry which, however, forms no part of the present invention.

APPENDIX 1
GENERAL (1) $V = \{\text{Modulation or Video}\}\{\text{Carrier}\}$
(2) $V_{i1} = \{V_1(t)\}\{\exp[j\omega_1 t]\}$
(3) $V_{i2} = \{V_2(t)\}\{\exp[j\omega_2 t]\}$
(4) $S_{1p}(t,z) = K_1(\omega_1)\{V_1(t + t_{1p} - z/v)\}\{\exp[j\omega_1(t + t_{1p} - z/v)]\}$
(5) $S_{2p}(t,z) = K_2(\omega_2)\{V_2(t + t_{2p} - z/v)\}\{\exp[j\omega_2(t + t_{2p} - z/v)]\}$
(6) $\{V_3(t)\}\{\exp(j\omega_3 t)\} = g_s\{V_1(t)V_2(t)\}\{\exp[j(\omega_1 + \omega_2)t]\}$
(7) $\{V_3(t)\}\{\exp(j\omega_3 t)\} = g_d\{V_1^*(t)V_2(t)\}\{\exp[j(\omega_2 - \omega_1)t]\}$
(8) $A \sum_{p=0}^{P-1} g_p\{v_1^*(t + t_{1p} - t_o)V_2(t + t_{2p} - t_o)\}\exp[j(\omega_2 - \omega_1)t + j\omega_2(t_{2p} - t_o) - j\omega_1(t_{1p} - t_o)]\}$
(9) $t_{1p} = t_{1o} - p\, a_{1p}\Delta T$
(10) $-\{t_o - t_{1p}\} = -\{t_o - (t_{1o} - p\, a_{1p}\Delta T)\}$
(11) $-\{t_o - t_{1p}\} = -\{t_o - t_{1o} + p\, a_{1p}\Delta T\}$
(12) $-\{t_o - t_{1p}\} = -\{\text{Elec } \phi + p\, a_{1p}\Delta T\}$
(13) $V_1^*(t + t_{1p} - t_o) = V_1^*(t + p\, a_{1p}\Delta T)$
(14) $V_3(t)\exp(j\omega_3 t) = A \sum_{p=0}^{P-1} g_p\{V_1^*(t - p\, a_{1p}\Delta T)V_2(t - p\, a_{2p}\Delta T)\}\{\exp[j(\omega_2 - \omega_1)t + j\, p\Delta T(\omega_1 a_{1p} - \omega_2 a_{2p})]\}$
(15) $\omega_3 = \omega_2 - \omega_1$
(16) $p\Delta T(\omega_1 a_{1p} - \omega_2 a_{2p}) = 2\pi N$
(17) $f_1 a_{1p} - f_2 a_{2p} = \dfrac{n}{\Delta T}$, $n = N/p$
(18) $V_3(t) = A \sum_{p=0}^{P-1} g_p\{V_1^*(t - p\, a_1 \Delta T) V_2(t - p\, a_2 \Delta T)\}$

APPENDIX 2
CONVOLUTION (19) $a_1 = 1 \; ; \; a_2 = -1$
(20) $V_3(t) = A \sum_{p=0}^{P-1} g_p\{V_1^*(t - p\Delta T) V_2(t + p\Delta T)\}$

APPENDIX 3
CORRELATION (21) $a_1 = \; ; a_2 = 1$
(22) $V_3(t) = A \sum_{p=0}^{P-1} g_p\{v_1^*(t - 2p\Delta T) V_{2(t - p\Delta T)}\}$

APPENDIX 4
PROGRAMMABLE TRANSVERSAL FILTER (23) $a_1 = a_2 = 1$
(24) $V_1^*(t - p\Delta T) = 1$
(25) $V_3(t) = A \sum_{p=0}^{P-1} \{g_p\}_{v_2}(t - p\Delta T)\}$

APPENDIX 5
DISCRETE FOURIER TRANSFORM (26) define $\mu = B\pi/T$ ; where $T = p\Delta T$
(27) $V_1(t) = V_2(t) = \exp(j\mu t^2)$
(28) $V_3(t) = A \sum_{p=0}^{P-1} g_p\{\exp(-j\, 4\mu tp\Delta T)\}$
(29) for $t = t_m = \dfrac{m}{2B}$, $m = 0, 1, \ldots P-1$
(30) $V_3(t_m) = A \sum_{p=0}^{p-1} g_p\{\exp(-j\pi m \dfrac{p}{P})\}$

APPENDIX 5-continued
DISCRETE FOURIER TRANSFORM (31) $V_3(t)_m = AK \sum_{p=0}^{P-1} V_p\{\exp(-j2\pi m \dfrac{p}{P})\}$ Although the invention has been shown and described with respect to exemplary embodiments thereof, in connection with circuitry to be used therewith in a variety of exemplary applications, it should be understood by those skilled in the art that the invention may be practiced in a wide variety of configurations and utilizations, some of which are described hereinbefore, and that the foregoing and various other changes, ommissions and additions may be made in and to the invention without departing from the spirit and the scope thereof.

Having thus described typical embodiments of my invention, that which I claim as new and desire to secure by Letters Patent of the United States is:

1. A surface acoustic wave signal processing module comprising:
    a piezoelectric substrate having major surface; and
    metallization on said major surface disposed to provide a plurality of acoustoelectrical transducers on the surface of said substrate, each of said acoustoelectric transducers being disposd in a corresponding one of a plurality of lines parallel with the preferred direction of propagation of said substrate, the transducers in each of said lines forming a related one of a corresponding plurality of processing channels, each of said channels having at least three transducers therein, said transducers also disposed in groups to provide processing ports, each port consisting of one transducer in each of the channels, the transducers of at least one of the ports being electrically independent of each other and the transducers of at least one of the ports being electrically interconnected in common with each other, the spacing of the transducers of a first one of the ports with respect to a second one of the ports being different from the spacing of the transducers of said first port with respect to a third one of the ports, each of said transducers oriented for coupling with waves traveling parallel to said preferred direction.

2. A surface acoustic wave signal processing module according to claim 1 wherein the port having electrically-independent transducers is disposd with free access to an edge of the surface of said module, whereby the independent electrical connections to the transducers thereof need not extend across the interaction region defined by the surface of said module between any of the transducers of related channels thereof.

3. A surface acoustic wave signal processing module according to claim 1 wherein the metallization on the surface of said substrate is arranged to provide two ports having electrically interconnected transducer segments, and one port having electrically-independent transducer segments.

4. A surface acoustic wave signal processor module comprising:
    a piezoelectric substrate having a major surface; and
    a plurality of acoustoelectric coupling transducers disposed on said major surface, said transducers arranged on said major surface so as to provide at least three transducers along each one of a plurality of lines parallel with the preferred direction of propagation of said substrate, thereby defining processing channels having at least three transducers in each processing channel, said transducers oriented for coupling with waves traveling parallel with said preferred direction, said transducers also arranged in related groups, each group having a transducer of each of said channels therein, each group comprising a signal processing port, the transducers of at least one of said ports being electrically independent from each other on said major surface and the transducers of at least one of said ports being electrically interconnected with each other on said major surface, the transducer-to-transducer spacing along the related channels between a first one of said ports and a second one of said ports being different from that between said first port and a third one of said ports.

5. A surface acoustic wave signal processor according to claim 4 wherein the transducers of two of said ports are respectively electrically connected in common.

* * * * *

UNITED STATES PATENT AND TRADEMARK OFFICE
CERTIFICATE OF CORRECTION

PATENT NO. : 4,114,116
DATED : September 12, 1978
INVENTOR(S) : Thomas M. Reeder It is certified that error appears in the above-identified patent and that said Letters Patent are hereby corrected as shown below:

| | |
|---|---|
| Column 3, line 36 | "to" should read --so-- |
| Column 4, lines 55-57 | Delete "And the transducers are... along the channels." |
| Column 4, line 66 | should read: --lithium niobate substrate. And the transducers are, as shown, oriented for coupling with waves traveling in the preferred direction, along the channels.-- |
| Column 12, line 41 | "acorss" should read --across-- |
| Column 15, line 5 | "Gurdkowski" should read --Grudkowski-- |
| Column 15, line 8 | "matallization" should read --metallization-- |
| Column 13, line 12 | "operationg" should read --operating-- |

Column 15, Equation (8) should read:

$$(8) \quad A \sum_{p=0}^{P-1} g_p \{V_1^*(t + t_{1p} - t_o) V_2(t + t_{2p} - t_o)\} \{\exp[j(\omega_2 - \omega_1)t + j\omega_2(t_{2p} - t_o) - j\omega_1(t_{1p} - t_o)]\}$$

Column 15, Equation (11) should read:

$$(11) \quad -\{t_o - t_{1p}\} = -\{t_o - t_{1o} + p\, a_{1p}\, \Delta T\}$$

UNITED STATES PATENT AND TRADEMARK OFFICE
CERTIFICATE OF CORRECTION

PATENT NO. : 4,114,116
DATED : September 12, 1978
INVENTOR(S) : Thomas M. Reeder It is certified that error appears in the above—identified patent and that said Letters Patent are hereby corrected as shown below:

Column 15, Equation (21) should read:

(21) $a_1 = 2 \; ; \; a_2 = 1$

Column 15, Equation (22) should read:

(22) $V_3(t) = A \sum_{p=o}^{P-1} g_p \{V_1^*(t - 2p\Delta T) \, V_2(t - p\Delta T)\}$ Column 15, Equation (25) should read:

(25) $V_3(t) = A \sum_{p=o}^{P-1} \{g_p\}\{V_2(t - p\Delta T)\}$

Column 15, Equation (30) should read:

(30) $V_3(t_m) = A \sum_{p=o}^{P-1} g_p \{\exp(-j2\pi m \frac{p}{P})\}$

Column 16, Equation (31) should read:

(31) $V_3(t_m) = AK \sum_{p=o}^{P-1} V_p \{\exp(-j2\pi m \frac{p}{P})\}$

UNITED STATES PATENT AND TRADEMARK OFFICE
CERTIFICATE OF CORRECTION

PATENT NO. : 4,114,116
DATED : September 12, 1978
INVENTOR(S) : Thomas M. Reeder It is certified that error appears in the above-identified patent and that said Letters Patent are hereby corrected as shown below:

Column 16, line 15    "ommissions" should read --omissions--

Column 16, line 50    "disposd" should read --disposed--

Signed and Sealed this

Twenty-fourth Day of April 1979

[SEAL]

Attest:

RUTH C. MASON
Attesting Officer

DONALD W. BANNER
Commissioner of Patents and Trademarks